(12) United States Patent
Ciraldo

(10) Patent No.: US 12,342,589 B2
(45) Date of Patent: Jun. 24, 2025

(54) SEMICONDUCTOR SUBSTRATE

(71) Applicant: Advanced Diamond Holdings, LLC, Beltsville, MD (US)

(72) Inventor: John P. Ciraldo, Clarksburg, MD (US)

(73) Assignee: Advanced Diamond Holdings, LLC, Beltsville, MD (US)

( * ) Notice: Subject to any disclaimer, the term of this patent is extended or adjusted under 35 U.S.C. 154(b) by 0 days.

(21) Appl. No.: 18/404,665

(22) Filed: Jan. 4, 2024

(65) Prior Publication Data

US 2024/0222439 A1 Jul. 4, 2024

Related U.S. Application Data

(60) Provisional application No. 63/436,992, filed on Jan. 4, 2023.

(51) Int. Cl.
*H10D 62/80* (2025.01)
*H01L 21/02* (2006.01)

(52) U.S. Cl.
CPC ....... *H10D 62/80* (2025.01); *H01L 21/02376* (2013.01); *H01L 21/02491* (2013.01); *H01L 21/02516* (2013.01); *H01L 21/0254* (2013.01); *H01L 21/02565* (2013.01); *H01L 21/02634* (2013.01)

(58) Field of Classification Search
CPC ............... H01L 29/26; H01L 21/02376; H01L 21/02491; H01L 21/02516; H01L 21/0254; H01L 21/02565; H01L 21/02634; H01L 21/0242; H01L 21/02458; H01L 21/02488; H01L 21/02502; H01L 21/0262; H10D 62/80
See application file for complete search history.

(56) References Cited

U.S. PATENT DOCUMENTS

| | | | | |
|---|---|---|---|---|
| 5,144,380 A | * | 9/1992 | Kimoto | H01L 21/02433 257/481 |
| 2002/0076906 A1 | * | 6/2002 | Hilt | H01L 21/02428 257/E21.127 |
| 2006/0176924 A1 | * | 8/2006 | Kim | H01S 5/18327 372/50.11 |
| 2007/0269964 A1 | | 11/2007 | Sung | |
| 2014/0110722 A1 | | 4/2014 | Kub et al. | |
| 2014/0141595 A1 | | 5/2014 | Babic et al. | |
| 2014/0145314 A1 | * | 5/2014 | Wang | H01L 21/02532 257/632 |
| 2018/0151404 A1 | | 5/2018 | Francis | |
| 2020/0208298 A1 | | 7/2020 | Ciraldo et al. | |

OTHER PUBLICATIONS

International Search Report and Written Opinion for International Application No. PCT/US24/10337, mailed Apr. 11, 2024, 7 pages.

* cited by examiner

*Primary Examiner* — Dale E Page
*Assistant Examiner* — Quovaunda Jefferson
(74) *Attorney, Agent, or Firm* — Nutter McClennen & Fish LLP

(57) ABSTRACT

A method for manufacturing a semiconductor substrate. The method provides a single-crystal diamond base layer. The method then forms a beryllium oxide (BeO) layer over the single-crystal diamond base layer. The method then forms a gallium nitride (GaN) layer over the BeO layer. In some embodiments, the method forms surfactants over the single-crystal diamond base layer and the BeO layer.

16 Claims, 4 Drawing Sheets

SEMICONDUCTOR SUBSTRATE

PRIORITY

This patent application claims priority from provisional U.S. patent application No. 63/436,992, filed Jan. 4, 2023, entitled, "SEMICONDUCTOR SUBSTRATE," and naming John P. Ciraldo as the inventor, the disclosure of which is incorporated herein, in its entirety, by reference.

FIELD

Illustrative embodiments of the invention generally relate to semiconductors and, more particularly, various embodiments of the invention relate to manufacturing a semiconductor substrate.

BACKGROUND

A semiconductor device generates heat during operation. Excess heat limits the operational ratings of the semiconductor device. Gallium nitride (GaN) is an important material for a number of semiconductor applications, particularly power electronics applications having high power or high frequency requirements. The ratings of GaN semiconductor devices are constrained by the heat generated by the device during operation. Increasing the rate at which heat is dissipated from the GaN semiconductor device may increase the power rating or frequency rating of the GaN semiconductor device. One way to dissipate heat is to use highly thermally conductive substrates.

SUMMARY OF VARIOUS EMBODIMENTS

In accordance with one embodiment of the invention, a method for manufacturing a semiconductor substrate provides a single-crystal diamond base layer. A single-crystal beryllium oxide (BeO) layer is epitaxially grown over the single-crystal diamond base layer. A single-crystal gallium nitride (GaN) layer is epitaxially grown over the BeO layer.

In various embodiments, wherein the single-crystal diamond base layer has a grain size greater than 1 mm. The base layer 110 may have a thickness of 50-1100 microns, a thickness of 200-650 microns, or a thickness of 300-550 microns, among other thickness ranges. The inventors have found that thinner layers of diamond are not rigid and undesirably may fracture easily, making for difficult handling. While thicker diamond may be grown, the inventors have also determined that there is reduced value for thermal management in semiconductor applications with thicker diamond (e.g., thicker than 550 microns, particular thicker than 1100 microns).

The GaN layer 130 may contain a single GaN crystal. The GaN layer may be epitaxially grown as a seed layer to have a thickness of between about 10 nm and about 2 microns. This GaN seed layer 130 may form a "template" which may be shipped to an end user. The GaN seed layer 130 may be grown using a first growth method, such as hydride vapour-phase epitaxy (HVPE). An additional GaN layer 130 may be grown on top of the seed GaN layer 130, e.g., by a customer who receives the template. The seed GaN layer 130 may advantageously reduce defects of subsequent GaN layers 130 grown thereon. The subsequent GaN layer 130 may be grown using a second growth method, such as Metal Organic CVD (MOCVD), CVD, and/or ALD. It can be helpful to have a GaN seed layer 130 on the surface between growing the subsequent GaN layer 130. The subsequent GaN layer 130 may be grown to a thickness of between about 2 microns and about 5 microns. Preferably, the total thickness of all of the GaN layers 130 is no more than about 5 microns. Although the GaN layers 130 may be grown using different methods at different times, the entire thickness of all contiguously grown GaN layers 130 may be considered a single semiconductor layer 130.

In various embodiments, a surface of the BeO layer or the single-crystal diamond base layer may be patterned. The surface of the BeO layer may be patterned to provide for elongated lateral overgrowth of the GaN layer over the pattern. The BeO layer may be epitaxially grown to have a thickness within a range inclusive of 3-500 nm, or a range inclusive of 5-15 nm, among other things.

Among other things, the method may provide a surfactant over the BeO layer before epitaxially growing the single-crystal GaN layer. In a similar manner, the method may provide a surfactant over the single-crystal diamond base layer before epitaxially forming the BeO layer. The surfactant may include a surfactant lattice constant value between a BeO lattice constant value and a GaN lattice constant value.

In accordance with an embodiment of the invention, a semiconductor substrate includes a single-crystal diamond base layer. The substrate also includes a single-crystal beryllium oxide (BeO) layer formed over the single-crystal diamond base layer. A single-crystal gallium nitride (GaN) layer is formed over the BeO layer.

In various embodiments, the single-crystal diamond base layer is configured to include a grain size greater than 1 mm. The GaN layer may be a seed layer configured to receive an additional GaN layer. The GaN layer may contain a single GaN crystal.

The device may include a surfactant located at an interface between the single-crystal diamond base layer and the BeO layer, or at an interface between the BeO layer and the GaN layer. The surfactant may include iridium or titanium. The surfactant may have a surfactant lattice constant value between a BeO lattice constant value and a GaN lattice constant value. A top surface of the BeO layer and/or the single-crystal diamond base layer may be patterned.

In accordance with another embodiment, a method manufactures a semiconductor substrate. The method provides a single-crystal diamond base layer. Then, a beryllium oxide (BeO) layer is epitaxially grown over the single-crystal diamond base layer. A growth surface of the BeO layer is patterned prior to epitaxially growing a gallium nitride (GaN) layer on the growth surface. The pattern is configured to provide elongated lateral overgrowth of the GaN layer when the GaN layer is epitaxially grown over the BeO layer. In various embodiments, the GaN layer is single-crystal. The single-crystal diamond base layer may have a grain size greater than 1 mm.

The method may epitaxially grow a single-crystal GaN layer over the BeO layer. In some embodiments, the method may provide a surfactant over the BeO layer. The surfactant may have surfactant lattice constant value between a BeO lattice constant value and a GaN lattice constant value.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a single-crystal gallium nitride semiconductor is grown over diamond. Because diamond is highly thermally conductive, the entire substrate advantageously provides improvements over known substrates. The substrate includes a single-crystal diamond base layer, a single-crystal beryllium oxide (BeO) intermediate layer epitaxially grown over the diamond, and a single-crystal gallium nitride (GaN) layer grown over the beryllium oxide layer. In some embodiments, a growth surface of the BeO layer or the GaN layer may be patterned and/or have a surfactant thereon. Details of illustrative embodiments are discussed below.

Figure 1:
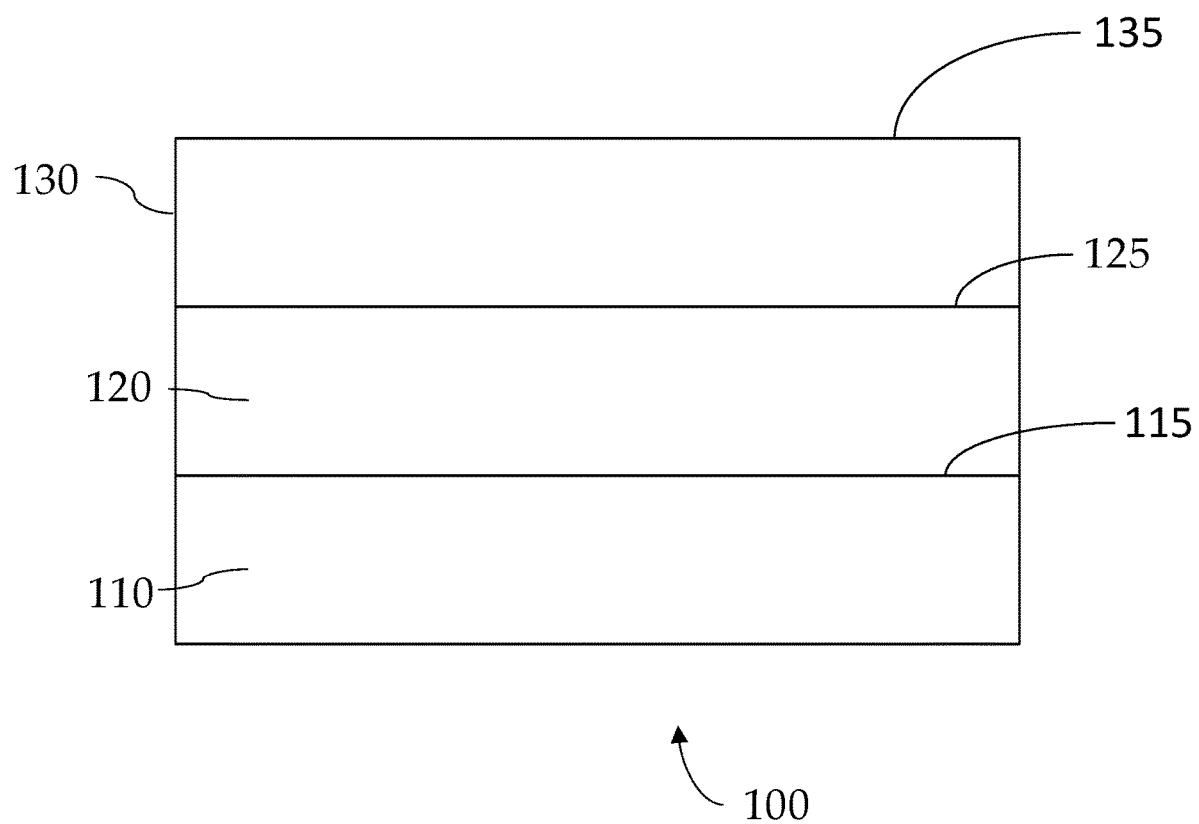
FIG. 1 schematically shows a semiconductor substrate in accordance with illustrative embodiments.

FIG. 1 schematically shows a semiconductor substrate 100 in accordance with illustrative embodiments. The semiconductor substrate may include a Gallium Nitride (GaN) layer 130. In some embodiments, the GaN layer 130 is a material configured to allow the growth of GaN, which may include a semiconductive material, or another type of material. For example, the GaN layer 130 may include a seed layer comprised of GaN. As known in the art the semiconductor device is an electronic component that utilizes the electrical properties of semiconductors. Semiconductors are typically crystalline solids with a specific arrangement of atoms.

Various embodiments may advantageously produce a semiconductor substrate 100 such as diodes, transistors, integrated circuits, semiconductor memory, and/or optoelectronic devices, using the methods described herein. While GaN offer many advantages as a semiconductor material, GaN faces certain challenges and limitations. Some of the key issues associated with GaN semiconductors include:
- Cost: GaN-based devices can be more expensive to manufacture than traditional silicon-based devices. The cost of raw materials, such as gallium, is higher, and the manufacturing processes for GaN are more complex.
- Material Quality: Achieving high-quality GaN crystals is challenging, and defects in the crystal structure can affect device performance.
- Thermal Management: While GaN has relatively high thermal conductivity, managing heat remains a concern, especially in high-power applications. Efficient thermal management is crucial to prevent overheating and maintain the reliability and performance of GaN devices.
- Reliability Issues: GaN devices may experience reliability issues, such as premature failure, especially under certain operating conditions. Ensuring long-term stability and reliability is a focus of ongoing research and development efforts.
- Integration Challenges: Integrating GaN with existing silicon-based technologies can be challenging. Although progress has been made in creating hybrid devices, achieving seamless integration and compatibility remains an area of active research.
- Process Complexity: Fabricating GaN-based devices involves complex processes, including epitaxial growth and precise control of doping. The complexity of these processes can contribute to higher manufacturing costs and challenges in scaling up production.

The most common semiconductor material is silicon, but others, such as germanium and gallium arsenide, are also used. As described further below, GaN provides a number of advantages over other semiconductor materials, such as silicon carbide. Advantages include higher voltage, higher power capacity, higher current throughput. In the content of a battery, this equates to faster charging. Overall, there is less loss in the electronics. This can also advantageously aid in the gate length of the device (i.e., how many devices you can fit onto a chip).

A large problem with semiconductor devices is heat buildup and breakdown of performance in the device gets hotter. Computers may now dynamically change the voltage and step down the performance of the chips to respond to the increase in heat. However, there are other contexts (e.g., high-power device), where reducing performance is undesirable. For example, the Tesla Model S Plaid electric vehicle (EV) is known for rapid acceleration. The EV may overheat, and car performance suffers as a result.

In various embodiments, it is highly desirable to remove heat from the semiconductor substrate 100. The ability to pull heat from the substrate 100 is dependent on the conductivity of the material that is pulling heat out of the device/junction and the distance that the material is from the junction. In some embodiments, the ability to pull heat from the substrate 100 may be represented by the following formula, where k is the material conductivity, $q_v$ is the rate at which energy is generated per volume of the medium, p is the density, and $c_p$ is the specific heat capacity.

$$\frac{\partial}{\partial x}\left(k\frac{\partial T}{\partial x}\right)+\frac{\partial}{\partial y}\left(k\frac{\partial T}{\partial y}\right)+\frac{\partial}{\partial z}\left(k\frac{\partial T}{\partial z}\right)+q_v = \rho c_p \frac{\partial T}{\partial z} \quad (1)$$

For simplicity, near the junction, heat conductivity is approximately proportional to $1/r^2$. Accordingly, illustrative embodiments advantageously apply a single molecule or atom thickness of surfactant 140, 150, and/or grow the BeO layer 120 thin (while still providing sufficient material for epitaxial growth), so as to reduce the distance of the diamond layer 110 from the GaN layer 130.

Illustrative embodiments use bulk diamond material to help with thermal management. Diamond has highly desirable thermal conductivity properties. The inventors discovered that single-crystal GaN may be grown over single-crystal diamond by epitaxially growing a single-crystal interface layer 120 of BeO between the diamond and the GaN. Preferably, the interface layer 120 is thin (e.g., a less than 1 micron thick) such that the distance between the GaN and the diamond is small. Illustrative embodiments may also be used to grow polycrystalline stacks (e.g., polycrystalline diamond, BeO, and/or GaN).

This advantageously reduces the need for complex/thick heterostacks and/or diamond bonding methods for coupling diamond to GaN. Illustrative embodiments advantageously solve one or more of the above problems by epitaxially growing single-crystal GaN over a single-crystal diamond layer. In particular, a diamond base layer 110 is provided. The diamond base layer 110 is oriented such that a top surface of the diamond is a base growth surface 115. A BeO layer 120 is grown over the base growth surface 115. The BeO layer 120 also defines an intermediate growth surface 125, on which the GaN layer 130 is grown.

By growing single crystal GaN, illustrative embodiments offer several advantages compared to polycrystalline or other crystal GaN structures. For example, single-crystal GaN produced using the processes described herein advantageously may provide:

- High Purity and Quality: Single crystal GaN exhibits higher purity and superior crystal quality compared to polycrystalline counterparts. This results in fewer crystal defects and a more uniform structure, contributing to better electrical and optical performance of devices.
- Improved Electron Mobility: The single crystal structure of GaN allows for better control over the arrangement of atoms, leading to higher electron mobility. This property is crucial for high-frequency and high-power applications, as it enhances the speed and efficiency of electronic devices.
- Better Thermal Conductivity: Single crystal GaN generally has better thermal conductivity than polycrystalline materials. This is important for applications where efficient heat dissipation is critical, as it helps in preventing overheating and maintaining the reliability of electronic devices.
- Enhanced Optoelectronic Properties: Single crystal GaN is often used in the development of optoelectronic devices, such as high-brightness LEDs and laser diodes. The precise crystal structure allows for better control over the emission properties, leading to improved efficiency and performance.
- Reduced Dislocation Density: Single crystal GaN can have lower dislocation density compared to polycrystalline forms. Dislocations can negatively impact the electrical and optical properties of semiconductor devices, so reducing their density is beneficial for device performance.
- Uniform Electrical Properties: The single crystal structure provides uniform electrical properties throughout the material, contributing to the consistency and reliability of GaN devices. This is particularly important in applications where precise control over electronic characteristics is crucial.
- Increased Breakdown Voltage: Single crystal GaN can exhibit higher breakdown voltage compared to polycrystalline forms. This property is advantageous for power electronics applications, as it allows devices to withstand higher voltages without breakdown.

While single crystal GaN offers these advantages, it is worth noting that the production of high-quality single crystal GaN can be technically challenging and expensive. Researchers and manufacturers continue to explore ways to improve crystal growth techniques and reduce production costs to make single crystal GaN more accessible for a broader range of applications.

Some embodiments may grow single-crystal GaN over a different, non-diamond base structure 110. Diamond is highly thermally conductive, and therefore, the grown GaN on BeO on single-crystal diamond heterostructure is advantageously highly thermally conductive. Accordingly, it can be highly desirable to provide a substrate having GaN coupled with single-crystal diamond.

Some other embodiments may couple GaN with diamond by growing the GaN over a non-diamond material, such as silicon carbide, remove the single-crystal GaN material from the non-diamond base structure, transfer the GaN in vacuum, and then bond the GaN to diamond. This process undesirably requires shaving down the non-diamond base structure, and then adhering the GaN directly to the diamond to provide for enhanced heat conductivity. This process is undesirable complex and has a number of disadvantages, including reduced device reliability.

Various embodiments advantageously grow epitaxially grow a GaN layer 130 over the diamond layer 110 using one or more intermediate layers 120 (e.g., one or more epitaxial layers 120).

Figure 2:
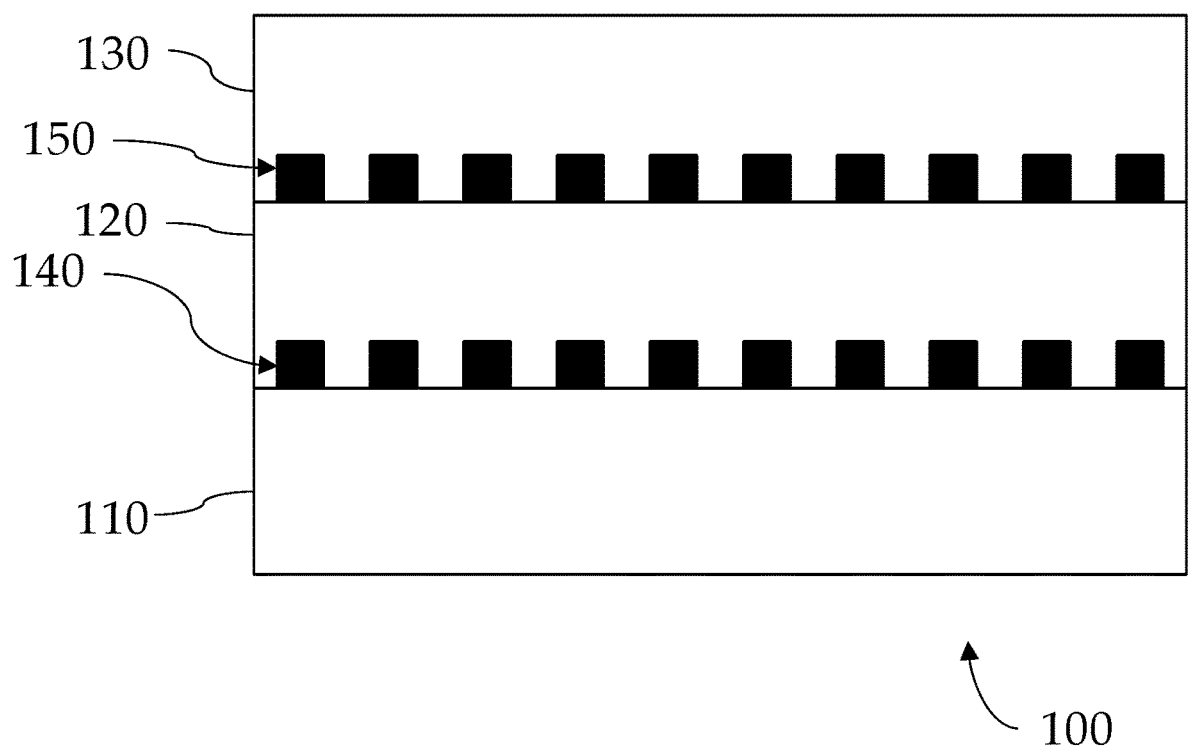
FIG. 2 schematically shows a cross-sectional view of the integrated semiconductor substrate in accordance with illustrative embodiments.

FIG. 2 schematically shows a cross-sectional view of the integrated semiconductor substrate 100, configured to be highly thermally conductive and electrically insulative. The semiconductor substrate 100 is configured as an epitaxial heterostructure in that at least one layer is grown on a layer comprised of a different material. It should be appreciated that the dimensions illustrated in the figures are not drawn to scale.

The semiconductor substrate 100 has the base layer 110 that forms a surface onto which another material may be epitaxially grown. Among other things, the base layer 110 may be include diamond material (e.g., natural or lab-grown diamond). Preferably, the base layer is single-crystal, such that layers grown thereon may be single-crystal. The diamond may have a continuous and unbroken crystal lattice without grain boundaries, also known as a single-crystal or monocrystalline structure. In some embodiments, the grain of the single-crystal structure has at least one dimension of at least 1 mm. For example, the base layer 110 may have a single-crystal diamond onto which the other layers of the semiconductor substrate are formed. The base layer 110 may be configured as a wafer, among other things. The base layer 110 may have a thickness of 50-1100 microns, a thickness of 200-650 microns, or a thickness of 300-500 microns, among other thickness ranges.

In various embodiments, the semiconductor substrate 100 may include a surfactant 140 configured to aid in lattice relaxation or aid in the epitaxial formation of an epitaxial layer 120 over the base layer 110. The surfactant 140 may be provided in the form of a fractional monolayer that is applied to the base layer 110 (i.e., on the growth surface 115 or the growth surface 125) prior to growth of the subsequent layer (e.g., prior to the growth of the epitaxial layer 120 or the GaN layer 130). The surfactant may be applied, for example, using physical vapor deposition (e.g., sputtering or thermal evaporation) or atomic layer deposition (ALD). The surfactant 140 may aid in the formation of a single-crystal epitaxial layer 120 over the single-crystal base layer 110. The surfactant 140 may have a lattice constant between the lattice constant of the two layers that it interfaces with (e.g., between the lattice constant of the base layer 110 and the lattice constant of the epitaxial layer 120).

In some embodiments, the surfactant 140 may include iridium or titanium, among other things. The surfactant 140 may be a monolayer—i.e., having the thickness no greater than one molecule, or in some cases, no greater than one atom. In some embodiments, the surfactant 140 may include more than one material deposited between the base layer 110 and the epitaxial layer 120. The surfactant 140 may be configured as a partial monolayer such that the surfactant 140 covers only a portion of the base layer 110 over which the epitaxial layer 120 forms, as illustrated in FIG. 1. In some embodiments, the surfactant 140 is a partial monolayer covering 10-75% of the epitaxial layer-facing surface of the base layer 110. In some embodiments, the surfactant 140 is a partial monolayer covering 25-50% of the epitaxial layer-facing surface of the base layer 110. It should be apparent that even with the surfactant 140, the epitaxial layer 120 and the base layer 110 are in intimate contact. The layers 110 and 120 are atomically bonded, except in some places where bonding is interrupted by atoms from the surfactant 140. However, some embodiments may not include the surfactant 140. In such embodiments, the growth between the epitaxial layer 120 and the base layer 110 may be pseudomorphic.

Figure 3A:
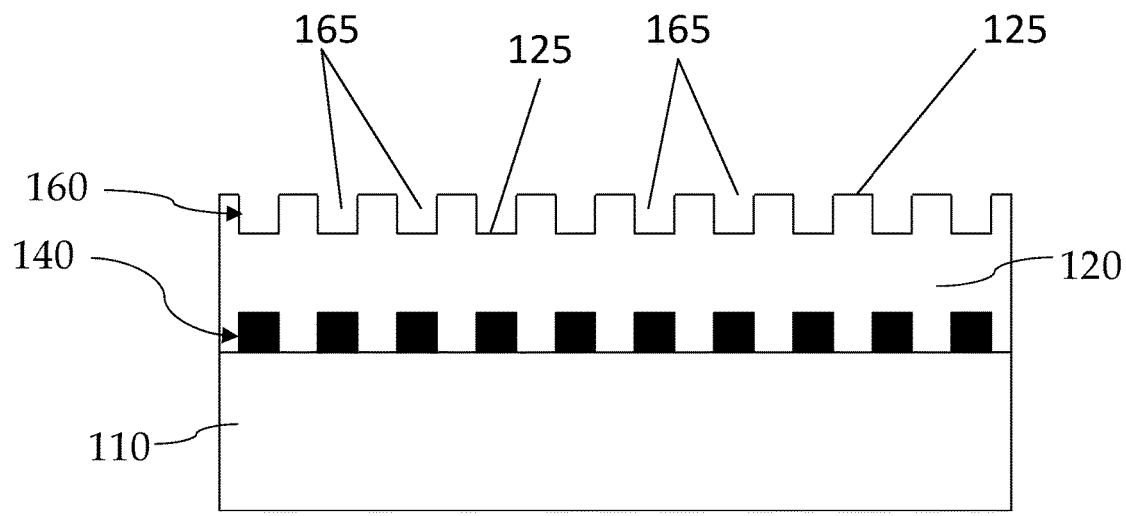
FIGS. 3A-3B schematically show the substrate in accordance with illustrative embodiments.
Figure 3B:
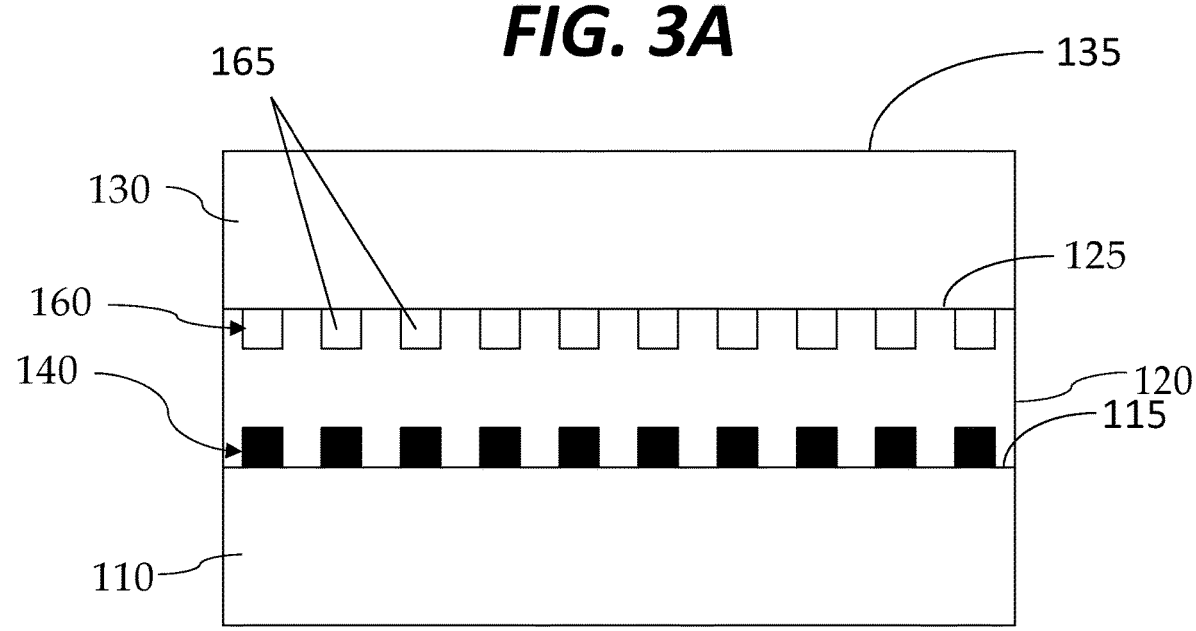

FIGS. 3A-3B schematically show the substrate 100 in accordance with illustrative embodiments. As shown, in addition, or alternatively, to the surfactant 140, 150, illustrative embodiments may pattern the growth surfaces 115 or 125. For example, the growth surface 125 may include a pattern 160 that may be etched into the growth surface 125, resulting in voids/gaps 165 in the surface 125.

Although FIG. 3A shows the etched surface 125 as forming small square shaped gaps 165, it should be understood that those skilled in the art may use a variety of width, pitch, dimensions, number of gaps 165, distance between gaps 165, etc., among other things, to create a desired pattern for GaN growth. For example, instead of a square gaps 165, the etched gap 165 may have a V-shape, or a U shape. Preferably, the size of the gaps 165 are sufficiently small that growth over the surface doesn't fill the gaps 165. Instead, elongated lateral overgrowth may occur over the gaps 165 as shown in FIG. 3B. The process of elongated lateral overgrowth is described in co-pending U.S. patent application Ser. No. 18/229,053, which is incorporated herein by reference in its entirety. As shown in FIG. 3B, when the GaN layer 130 is epitaxially grown over the pattern 160, the gaps 165 may remain, but GaN material grows across the gap. The GaN material that grows across the gap provides GaN material of highly reduced stress/high quality.

Although shown on the BeO layer 120, in some embodiments, the diamond base layer 110 (e.g., the growth surface 115) may include a physical pattern 160 configured to increase the surface energy of the exposed surface 115 over which subsequent layers 120 are formed. The physical pattern may be formed on the exposed surface 115 of the base layer 110, or a physical pattern formed on a material formed over the base layer 110. For example, the pattern 160 may include a lithographed or etched pattern. The pattern 160 may include pillars or conical shapes. The pillars may have round or polygonal cross sections.

The epitaxial layer 120 is epitaxially grown over the base layer 110. Accordingly, the epitaxial layer 120 permits the deposition of an otherwise incongruent semiconductor material over the base layer 110. The epitaxial layer 120 may have a thickness within a range inclusive of 3-500 nm, or a range inclusive of 5-15 nm, among other things. In some embodiments, the epitaxial layer 120 is formed directly over the base layer 110 without an intermediate layer. While BeO is thermally conductive, it is not as thermally conductive as diamond. Therefore, illustrative embodiments preferably limit the thickness of the BeO layer 120. However, sufficient structure is required to allow for subsequent growth of the semiconductor GaN layer 130. The inventors have found that BeO films of less than 3 nm are not effective for subsequent epitaxial growth thereon and tend to be defective. Furthermore, the inventors have found that BeO films over 500 nm adds thickness that significantly undesirable impacts the thermal conductivity of the diamond layer.

Among other ways, illustrative embodiments may use atomic layer deposition, liquid-phase epitaxy, molecular beam epitaxy, pulsed laser deposition, high power impulse magnetron sputtering (HiPIMS), metal organic chemical vapor deposition (MOCVD), standard chemical vapor deposition, or other techniques to form layers on other layers of the substrate 100, such as forming the epitaxial layer 120 over the base layer 110. Those skilled in the art may use still other known techniques to form the epitaxial layer 120 over the base layer 110.

Epitaxial formation of the epitaxial layer 120 onto the base layer 110 may include crystal growth or material deposition in which new crystalline layers of the epitaxial layer 120 are formed with one or more well-defined orientations with respect to the base layer 110, which acts as a crystalline seed layer. Epitaxial deposition causes the deposited epitaxial layer 120 to take on a crystalline structure bearing similar lattice constants or multiples thereof of the base layer 110, which, in preferred embodiments, is monocrystalline.

The epitaxial layer 120 may comprise or consist of a material having high thermal conductivity. The epitaxial layer 120 may comprise or consist of beryllium oxide (BeO), thereby permitting the epitaxial formation of GaN onto a diamond base layer 110 using a material with high thermal conductivity. In other embodiments, the epitaxial layer may include BeO, as well as additives such as iridium or titanium. When epitaxially formed on a single-crystal diamond base layer 110, the BeO epitaxial layer 120 will also be monocrystalline.

The semiconductor substrate 100 has another surfactant 150 configured to aid in lattice relaxation or aid in the epitaxial formation of a material layer 13, such as semiconductor layer 130, over the epitaxial layer 120. The surfactant 150 may be configured to have a lattice constant between the lattice constant of the epitaxial layer 120 and the lattice constant of the semiconductor layer 130. In some embodiments, the substrate 100 does not include the surfactant 150, and grows the semiconductor layer 130 directly over the epitaxial layer 120 without the surfactant 150.

The surfactant 150 may include iridium or titanium, among other things. As with the other surfactant 140, the surfactant 150 may be a monolayer including a partial monolayer. The surfactant 150 may have more than one material deposited between the semiconductor layer 130 and the epitaxial layer 120. As a partial monolayer, the surfactant 150 may cover only a portion of the epitaxial layer 120 over which the semiconductor layer 130 forms, as illustrated in FIG. 1. In some embodiments, the surfactant 150 is a partial monolayer covering at least 10% of the seed layer-facing surface of the epitaxial layer 120. In some embodiments, the surfactant 150 is a partial monolayer covering 10-75% of the growth surface 125 of the epitaxial layer 120. In some embodiments, the surfactant 140 is a partial monolayer covering 25-50% of the growth surface 125 of the epitaxial layer 120.

As suggested above, the semiconductor layer 130 is configured to aid the deposition of a semiconductor onto the semiconductor substrate 100. For example, the semiconductor layer 130 may be comprised of GaN configured to receive an additional GaN semiconductor layer. The total thickness of the semiconductor layer 130 may be between about 2 microns and about 6 microns, among other thicknesses. Generally, it is desirable to keep the total thickness of the GaN layer 130 thinner, as heat is generally generated near the surface 135 of the GaN layer 130 (e.g., near or at the P-N junction for some devices, which is further away from the diamond layer 110). Thus, the thicker the GaN layer 130 is, the larger the distance between the point of heat generation of the GaN layer 130 and the diamond layer 110. In some embodiments, the semiconductor layer 130 contains a single GaN crystal.

In some embodiments, the semiconductor substrate 100 may include more or fewer layers. For example, the semiconductor substrate 100 may not include the surfactant 140, the surfactant 150, and/or the semiconductor layer 130. In another example, the semiconductor substrate 100 may include the base layer 110, the surfactant 140, and the epitaxial layer 120. In another example, the semiconductor substrate 100 may include the base layer 110, the epitaxial layer 120, and the semiconductor layer 130. In yet another example, the semiconductor substrate 100 may include the base layer 110, and the epitaxial layer 120 having a patterned growth surface 125. Such an arrangement may be referred to as a template, and can be sent offsite to grow GaN thereon.

Figure 4:
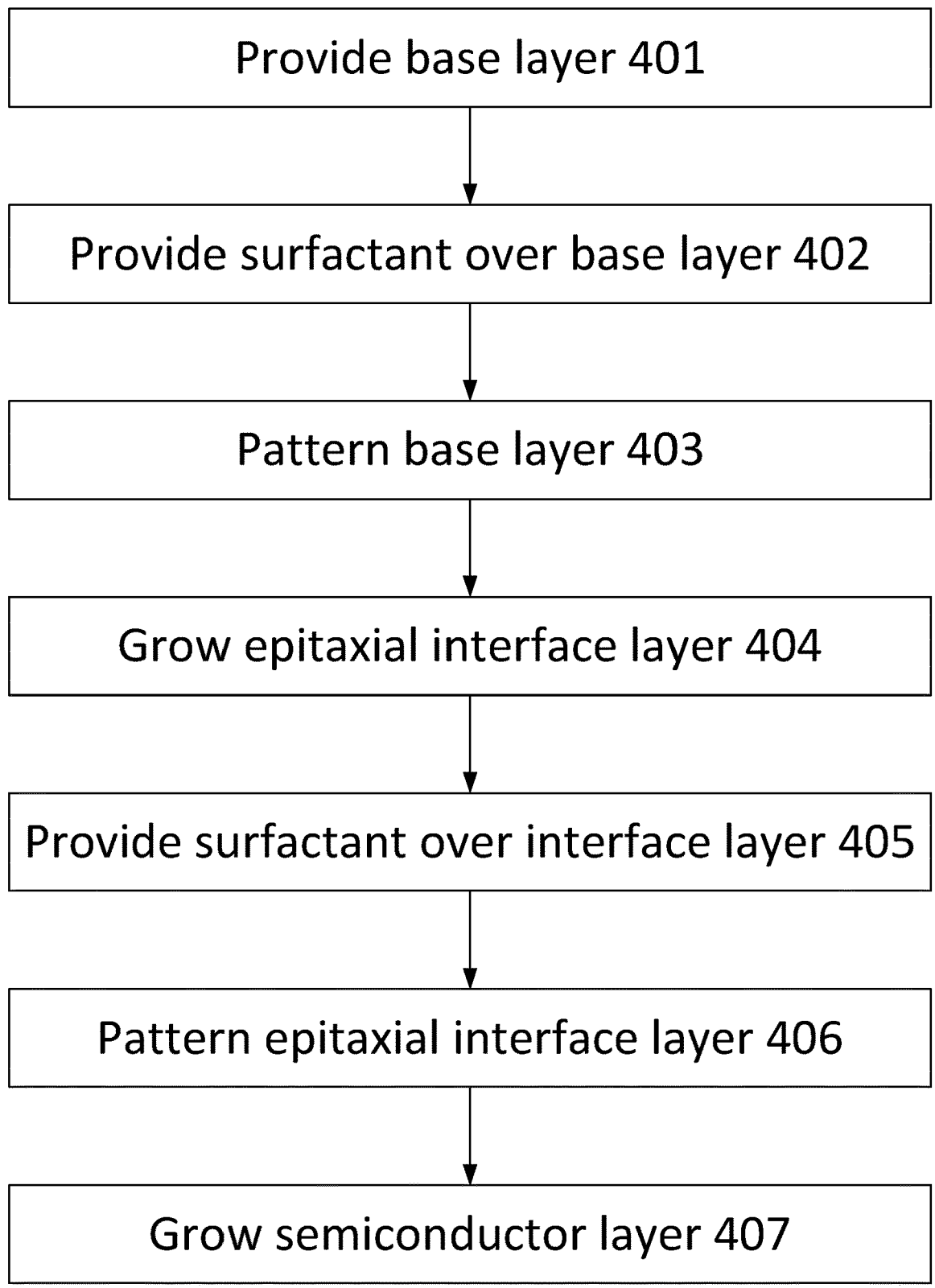
FIG. 4 shows a process for manufacturing a semiconductor substrate in accordance with various embodiments.

FIG. 4 shows an exemplary process 400 for manufacturing the semiconductor substrate 100 in accordance with various embodiments. It should be appreciated that a number of variations and modifications to the process 400 are contemplated including, for example, the omission of one or more steps of the process 400, the addition of further conditions and steps, or the separation of operations and conditionals into separate processes. In addition, some of the steps may be performed in a different order than that shown, or at the same time. Those skilled in the art therefore can modify the process as appropriate.

The process 400 begins at step 401 where the base layer 110 for the semiconductor substrate 100 is provided. The base layer 110 may comprise or consist of a single-crystal structure, such as a single-crystal diamond layer. When implemented as a diamond, the substrate 100 may be formed from a natural diamond and/or a laboratory grown diamond, preferably in the form of a wafer for batch semiconductor processing.

At step 402, the process provides surfactant 140 over the base layer 110 to aid in the epitaxial growth of the epitaxial layer 120 over the base layer 110. The surfactant 140 may include thin layers of additives, such as iridium or titanium, among other things.

At step 403, the process may additionally or alternatively with regard to step 402, form physical patterns 160 in the additive or the base layer 110 using, among other things, lithography or ion etching. In certain embodiments, the pattern 160 is not used and the operation 203 is omitted.

At step 404, the epitaxial layer 120 is epitaxially formed over the base layer 110 in operation. For example, a layer of BeO may be epitaxially formed over the base layer 110 of a single-crystal diamond. If the process uses steps 402 and/or 403, the BeO layer may be epitaxially grown over the pattern 160 (e.g., using elongated lateral overgrowth) and/or grown over the surfactant 140.

At step 405, similar to step 402, to aid in the formation of the semiconductor layer 130, the surfactant 150 may be provided over the epitaxial layer 120. Forming the surfactant 150 over the epitaxial layer 120 aids in the epitaxial growth of the semiconductor layer 130. The surfactant 150 may include thin layers of additives, such as iridium or titanium, among other things.

At step 406, the process may additionally or alternatively with regard to step 405, form patterns 160 in the epitaxial layer 120. The pattern used in step 406 may or may not be the same as the pattern used in step 403.

Step 407 then grows the semiconductor layer 130. Optionally, after step 406, the device is considered to be a "template" and can be shipped offsite for GaN layer 130 growth. A customer may simply grow GaN over the ready template. Alternatively, the GaN layer may be grown in the same CVD chamber as the earlier epitaxial growth.

The semiconductor layer 130 forms over the epitaxial layer 120 and surfactant 150 to aid in the epitaxial formation of another semiconductor layer onto the semiconductor substrate 100. For example, where a GaN semiconductor is grown using MOCVD, the semiconductor layer 130 of GaN forms over the epitaxial layer 120 using a non-MOCVD technique to allow the MOCVD-grown layer to be deposited onto the semiconductor substrate 100. The semiconductor layer 130 may have a thickness of 1-100 nm, among other thicknesses.

In the process 400, the semiconductor is formed over the semiconductor substrate 100 instead of forming the semiconductor substrate over the semiconductor. Some benefits of forming the layers of the semiconductor substrate 100 over the base layer 110 of a single-crystal diamond rather than growing the semiconductor substrate 100 onto a semiconductor may include the following:

1. The process 400 describes in illustrative embodiments produces less waste compared to other processes. The process 400 does not require the formation of a sacrificial layer to grow GaN, and therefore does not require the steps of growing GaN on a sacrificial layer and then transferring the GaN semiconductor from the sacrificial layer to the diamond layer.
2. The semiconductor substrate 100 formed by the process 400 may have a single-crystal diamond structure, which has higher heat transfer capabilities relative to the polycrystalline diamonds formed in other methods.
3. The process 400 does not require mechanical thinning to achieve the desired thicknesses of each layer of the semiconductor substrate 100.

It is contemplated that the various aspects, features, processes, and operations from the various embodiments may be used in any of the other embodiments unless expressly stated to the contrary. Certain operations illustrated may be implemented by a computer executing a computer program product on a non-transient, computer-readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" or "a portion" is used, the item can include a portion or the entire item unless specifically stated to the contrary. Unless stated explicitly to the contrary, the terms "or" and "and/or" in a list of two or more list items may connote an individual list item, or a combination of list items. Unless stated explicitly to the contrary, the transitional term "having" is open-ended terminology, bearing the same meaning as the transitional term "comprising."

The embodiments of the invention described above are intended to be merely exemplary; numerous variations and modifications will be apparent to those skilled in the art. Such variations and modifications are intended to be within the scope of the present invention as defined by any of the appended claims. It shall nevertheless be understood that no limitation of the scope of the present disclosure is hereby created, and that the present disclosure includes and protects such alterations, modifications, and further applications of the exemplary embodiments as would occur to one skilled in the art with the benefit of the present disclosure.

What is claimed is:

1. A method for manufacturing a semiconductor substrate, comprising:
   providing a single-crystal diamond base layer;
   providing a surfactant over the single-crystal diamond base layer before epitaxially growing a BeO layer over the single-crystal diamond base layer;
   epitaxially forming a single-crystal beryllium oxide (BeO) layer over the single-crystal diamond base layer; and
   epitaxially growing a single-crystal gallium nitride (GaN) layer over the BeO layer,
   wherein forming the surfactant includes patterning a surface of the single-crystal diamond base layer.

2. The method of claim 1, wherein the single-crystal diamond base layer has a grain size greater than 1 mm.

3. The method of claim 1, wherein the GaN layer contains a single GaN crystal.

4. The method of claim 1, comprising providing an additional surfactant over the BeO layer before epitaxially growing the single-crystal GaN layer.

5. The method of claim 1, wherein the surfactant includes a surfactant lattice constant value between a BeO lattice constant value and a GaN lattice constant value.

6. A semiconductor substrate, comprising:
   a single-crystal diamond base layer;
   a single-crystal beryllium oxide (BeO) layer formed over the single-crystal diamond base layer;
   a surfactant located at an interface between the single-crystal diamond base layer and the BeO layer, or at an interface between the BeO layer and the GaN layer; and
   a single-crystal gallium nitride (GaN) layer formed over the BeO layer,
   wherein the top surface of the BeO layer and/or the single-crystal diamond base layer is patterned.

7. The semiconductor substrate of claim 6, wherein the single-crystal diamond base layer is configured to include a grain size greater than 1 mm.

8. The semiconductor substrate of claim 6, wherein the GaN layer is a seed layer configured to receive an additional GaN layer.

9. The semiconductor substrate of claim 6, wherein the GaN layer contains a single GaN crystal.

10. The semiconductor substrate of claim 6, wherein the surfactant has a surfactant lattice constant value between a BeO lattice constant value and a GaN lattice constant value.

11. A method for manufacturing a semiconductor substrate, comprising:
    providing a single-crystal diamond base layer;
    epitaxially growing a beryllium oxide (BeO) layer over the single-crystal diamond base layer; and
    patterning a growth surface of the BeO layer prior to epitaxially growing a gallium nitride (GaN) layer on the growth surface, the patterning configured to provide elongated lateral overgrowth of the GaN layer.

12. The method of claim 11, wherein the single-crystal diamond base layer has a grain size greater than 1 mm.

13. The method of claim 11, comprising epitaxially growing a single-crystal GaN layer over the BeO layer.

14. The method of claim 11, further comprising providing a surfactant over the BeO layer.

15. The method of claim 14, wherein the surfactant has a surfactant lattice constant value between a BeO lattice constant value and a GaN lattice constant value.

16. The method of claim 14, wherein the surfactant includes iridium or titanium.

* * * * *